United States Patent
Jeon et al.

(10) Patent No.: US 9,635,626 B1
(45) Date of Patent: Apr. 25, 2017

(54) POWER AMPLIFYING APPARATUS AND METHOD USING SAME

(71) Applicant: Avago Technologies General IP (Singapore) Pte. Ltd., Singapore (SG)

(72) Inventors: Moon-Suk Jeon, Seoul (KR);
Jung-Min Oh, Gangnam-Gu (KR);
Joo-Min Jung, Gyeonggi-do (KR);
Jung-Hyun Kim, Gyeonggi-do (KR);
Yong-Bae Choi, Kyungnam Masan (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/927,968

(22) Filed: Oct. 30, 2015

(51) Int. Cl.
*H04W 52/52* (2009.01)
*H03F 1/02* (2006.01)
*H03F 3/19* (2006.01)
*H03F 3/21* (2006.01)

(52) U.S. Cl.
CPC .......... *H04W 52/52* (2013.01); *H03F 1/0205* (2013.01); *H03F 3/19* (2013.01); *H03F 3/21* (2013.01); *H03F 2200/451* (2013.01); *H03F 2200/555* (2013.01)

(58) Field of Classification Search
CPC ............. H03F 1/0205; H03F 3/19; H03F 3/21
USPC .......... 455/91, 108, 114.1, 114.2, 114.3, 126; 330/96, 268, 274
See application file for complete search history.

(56) References Cited

U.S. PATENT DOCUMENTS

| | | | |
|---|---|---|---|
| 7,034,620 B2 | 4/2006 | Khanifar et al. | |
| 8,779,857 B2 | 7/2014 | Pletcher et al. | |
| 2006/0057980 A1* | 3/2006 | Haque ................. | H03F 1/0238 455/127.1 |

OTHER PUBLICATIONS

Cripps, "RF Power Amplifiers for Wireless Communications", 2nd edition, Artech House, 2006, p. 343-352.

* cited by examiner

*Primary Examiner* — Tuan Pham

(57) ABSTRACT

A radio frequency (RF) power amplifier comprises an output stage amplifying circuit and a counterpart waveform generator. The output stage amplifying circuit receives a first waveform through an input node and amplifies the first waveform so as to output an amplified waveform through an output node. The counterpart waveform generator generates a second waveform corresponding to a portion of frequency components of the first waveform. The output stage amplifying circuit and the counterpart waveform generator are electrically coupled such that the second waveform is applied to the input node of the output stage amplifying circuit to substantially compensate the portion of frequency components of the first waveform.

17 Claims, 12 Drawing Sheets

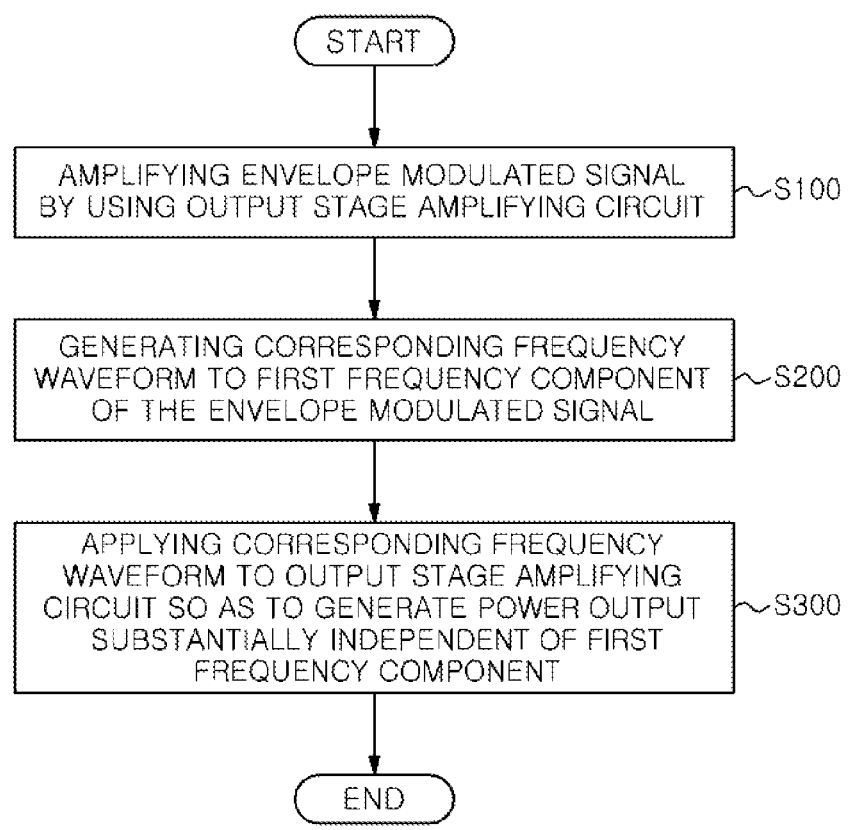

POWER AMPLIFYING APPARATUS AND METHOD USING SAME

BACKGROUND

A radio frequency (RF) power amplifier has a variety of applications in the field of wireless data communications. For example, an RF signal transmitter of a mobile telecommunications device is implemented by using the RF power amplifier.

Throughout the generations of mobile telecommunications technology development, the RF power amplifier has been required to support increasingly wider modulation signal bandwidth in order to accommodate increasingly higher speed data communications. For instance, the specification of the long-term evolution (LTE), commonly marketed as 4G LTE, requires a signal bandwidth of up to 20 MHz, which is several times larger than what is required in 3G wideband code division multiple access (W-CDMA) technology.

In designing a wideband RF power amplifier with a wider bandwidth, however, it tends to be more difficult to secure a required linearity within the entire range of the signal bandwidth due to various factors. Also, when discussing phenomena exhibited in relation to such factors, the concept of so-called 'memory effect' has been used.

Several solutions have been introduced to secure the required linearity. For instance, certain RF power amplifiers have employed digital predistortion (DPD) technique. However, in case the memory effect becomes severe, the advantage of the DPD technique is limited even after nonlinearity is maximally compensated by the DPD technique.

What is needed, therefore, is an apparatus and/or a method that overcomes at least the shortcomings of the RF power amplifier discussed above.

BRIEF DESCRIPTION OF THE DRAWINGS

The exemplary embodiments provided herein may be best understood when read with the accompanying drawings. It should be noted that various features depicted therein are not necessarily drawn to scale, for the sake of clarity and discussion. Wherever applicable and practical, like reference numerals refer to like elements.

FIG. 6 illustrates a flow chart of a method for amplifying a power signal in accordance with an embodiment of the present teachings.

DETAILED DESCRIPTION

In the following detailed description, for purposes of explanation but not limitation, representative embodiments disclosing specific details are set forth in order to facilitate a better understanding of the present invention. However, it will be apparent to one having ordinary skill in the art having had the benefit of the present disclosure that other embodiments in accordance with the present teachings that depart from the specific details disclosed herein may still remain within the scope of the appended claims. Moreover, descriptions of well-known apparatuses and methods may be omitted so as not to obscure the description of the representative embodiments.

It is to be understood that the terminology used herein is for purposes of describing particular embodiments only, and is not intended to be limiting. Any defined terms are in addition to the technical and scientific meanings of the defined terms as commonly understood and accepted in the technical field of the present invention.

As used in the specification and appended claims, the terms "a," "an" and "the" include both singular and plural referents, unless the context clearly dictates otherwise. Thus, for example, "a device" may include a single or plural devices.

Although the terms "first," "second," etc. may be used herein to describe various elements, these elements should not be limited by these terms. These terms are used to distinguish one element from another. For example, a first element could be termed a second element, and, similarly, a second element could be termed a first element, without departing from the scope of the present teachings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Hereinafter, a cellular mobile system in accordance with an embodiment of the present teachings is explained with reference to FIG. 1.

Figure 1:
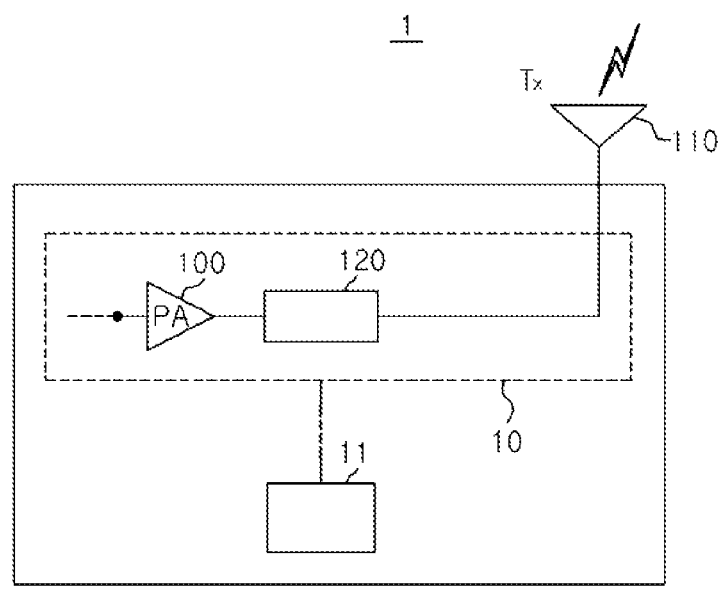
FIG. 1 illustrates a simplified schematic block diagram of a cellular mobile system in accordance with a representative embodiment.

FIG. 1 illustrates a simplified schematic block diagram of a cellular mobile system in accordance with a representative embodiment. Illustratively, the cellular mobile system 1 may be at least a portion of a wireless communications system which is implemented to support standards for wireless communication such as 3G WCDMA, 4G LTE, etc.

Referring to FIG. 1, the cellular mobile system 1 may comprise an RF signal transmitter 10. Further, in various embodiments, another component 11 within the purview of one of ordinary skill in the art may be incorporated into the cellular mobile system 1 without departing from the scope of the present teachings. Such component 11 may be a power source, a display, an interface, a keyboard, an audio/video subsystem, and/or any other component for enabling the cellular mobile system 1 to function as e.g., a mobile phone.

In accordance with a representative embodiment, the RF signal transmitter 10 may comprise an RF power amplifier 100 and an antenna 110. Further, in various embodiments, the RF signal transmitter 10 may further comprise an additional component 120, which may include, but is not limited to, a transmission line for transferring the RF signal, an impedance matching network for the antenna and/or a filter for filtering e.g., noises transferred together with the RF signal, or a combination thereof.

The RF power amplifier 100 is configured to output an RF signal. The RF power amplifier 100 may comprise one of RF power amplifiers 100a, 100b, 100c, 100d and their variants shown in subsequent drawings in FIGS. 2 to 4. The RF power amplifiers 100a, 100b, 100c, 100d and their variants will be discussed later. Further, the antenna 110 is configured to transmit the RF signal wirelessly.

Meanwhile, an RF power amplifier in accordance with of an embodiment of the present teachings is discussed hereinafter in reference with FIG. 2.

Figure 2:
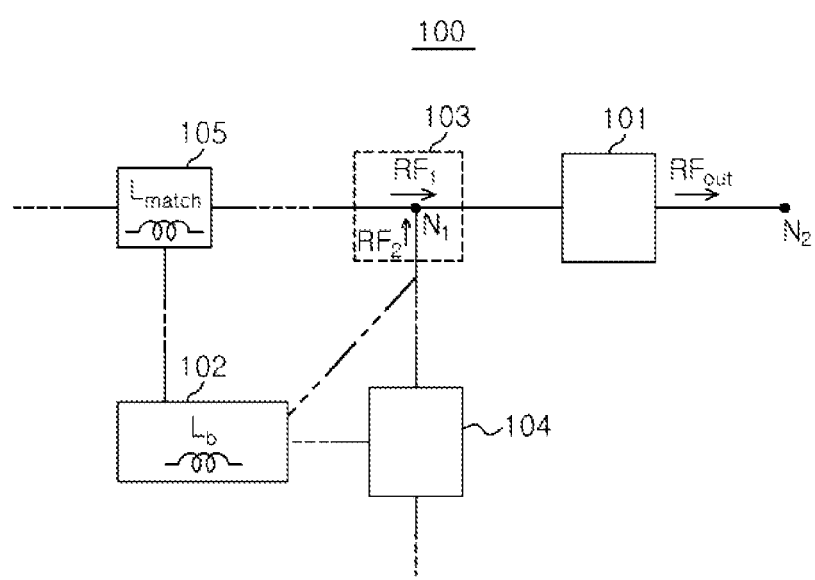
FIG. 2 illustrates a schematic view of an RF power amplifier in accordance with an embodiment.

FIG. 2 illustrates a schematic view of an RF power amplifier in accordance with an embodiment of the present teachings.

Referring to FIG. 2, the RF power amplifier 100a may be an example of the RF power amplifier 100 discussed earlier with reference to FIG. 1. The RF power amplifier 100a may be a cellular power amplifier. The RF power amplifier 100a as shown in FIG. 2 may comprise an output stage amplifying circuit 101 and a counterpart waveform generator 102. Optionally, in various embodiments, the RF power amplifier 100a may further comprise a compensation circuit 103, a bias circuit 104 and/or an impedance matching circuit 105 (which may also be referred to as "input matching circuit" hereinafter).

The output stage amplifying circuit 101, the counterpart waveform generator 102, the compensation circuit 103, the bias circuit 104 and the input matching circuit 105 may be coupled electrically or magnetically as illustrated in FIG. 2. The inter-connections between the circuits will be detailed later.

The output stage amplifying circuit 101 may comprise an input node $N_1$ and an output node $N_{out}$, and receive a waveform $RF_1$ through an input node $N_1$ and amplify the waveform $RF_1$ so as to output an RF signal (e.g., an amplified waveform $RF_{out}$) through an output node $N_{out}$. For instance, the waveform $RF_1$ may be a modulated envelope waveform in a communication system employing envelope tracking. In the embodiment shown in FIG. 2, the output stage amplifying circuit 101 may comprise a transistor such as a bipolar junction transistor (BJT). However, in another embodiment, other types of transistor such as a field effect transistor (FET) and/or specific types of the BJT and the FET within the purview of one of ordinary skill in the art may be incorporated into the output stage amplifying circuit 101. For instance, the transistor may be a heterojunction bipolar transistor (HBT), a metal-oxide semiconductor FET (MOSFET), a high electron mobility transistor (HEMT), a pseudomorphic HEMT (pHEMT), a heterostructure FET (HFET), etc.

In the representative embodiment of FIG. 2, the counterpart waveform generator 102 may be configured to generate a counterpart waveform in accordance with a specific portion of frequency components of the waveform $RF_1$ such that the counterpart waveform is adaptable to substantially compensate, cancel out or eliminate the specific portion of frequency components of the waveform $RF_1$ and to generate an output signal (e.g., an amplified waveform $RF_{out}$) that is substantially independent from the specific portion of frequency components of the waveform $RF_1$. For instance, the counterpart waveform generator 102 may be configured such that a waveform $RF_2$ corresponding to the specific portion of frequency components of the waveform $RF_1$ is generated from the counterpart waveform generator 102 per se or from another component, e.g., the bias circuit 104. The word "substantially compensate", "substantially cancel", and "substantially eliminate" may depend on the context and may not mean completely compensate, completely cancel or completely eliminate. For example, when signal "A" substantially cancels signal "B", a first order of the signal B may be canceled but a second order non-linearity portion of signal "B" may remain.

The specific portion of frequency components of the waveform $RF_1$ will be detailed later in reference to FIG. 8B, and may also be referred to hereinafter as "frequency component $F_C$" for purposes of discussion. (In other words, the waveform $RF_1$ comprises the frequency component $F_C$.)

In various embodiments, the counterpart waveform generator 102 and the output stage amplifying circuit 101 may be electrically coupled such that the waveform $RF_2$ is applied to the input node $N_1$ of the output stage amplifying circuit 101 to substantially compensate, cancel out or eliminate a portion of frequency components (e.g., the frequency component $F_C$) of the waveform $RF_1$, as detailed later.

The counterpart waveform generator 102 may comprise an inductor $L_b$. The inductor $L_b$ may be electrically coupled to the output stage amplifying circuit 101 (e.g., the input node $N_1$ thereof). The inductor $L_b$ may be configured to induce the waveform $RF_2$ from a magnetic coupling provided thereto. Further, the inductor $L_b$ may be electrically coupled between the bias circuit 104 and the output stage amplifying circuit 101 (e.g., the input node $N_1$ thereof). The inductor $L_b$ may have an inductance whose value is set such that a portion of frequency components (e.g., the frequency component $F_C$) of the waveform $RF_1$ is substantially eliminated.

Alternatively, in other embodiments, the inductor $L_b$ of the counterpart waveform generator 102 may be electrically coupled to the bias circuit 104 and the output stage amplifying circuit 101 in different way from what is discussed above. Specifically, such inductor may be configured to generate an intermediate waveform that causes the bias circuit to output the waveform $RF_2$. In such case, the counterpart waveform generator 102 may further comprise an additional component such as a capacitor, etc., which will be detailed later with reference to in an example shown in FIG. 5.

The compensation circuit 103 may be configured to receive the waveform $RF_1$ and substantially compensate a portion of frequency components (e.g., the frequency component $F_C$) of the waveform $RF_1$ provided thereto. The compensation circuit 103 may be configured to also receive the waveform $RF_2$. In the embodiment shown in FIG. 2, the compensation circuit 103 may be an input terminal comprising the input node $N_1$ of the output stage amplifying circuit 101. In other embodiments, the compensation circuit 103 may be a portion of the output stage amplifying circuit 101a or the bias circuit 104a where mixing of the signals takes place.

The bias circuit 104 may be configured to bias the output stage amplifying circuit 101. The bias circuit 104 may be electrically coupled to the input node $N_1$ of the output stage amplifying circuit 101. Such electrical coupling therebetween can be direct or indirect depending on embodiments.

The input matching circuit 105 may be configured to perform impedance matching for the output stage amplifying circuit 101. The input matching circuit 105 may be electrically coupled to the input node $N_1$ of the output stage amplifying circuit 101. The input matching circuit 105 may comprise an inductor $L_{match}$, and in such case, the magnetic coupling may be provided between the inductor $L_b$ and the inductor $L_{match}$ with a specific coefficient which is set such that a portion of frequency components (e.g., the frequency component $F_C$) of the waveform $RF_1$ is substantially eliminated.

Next, an RF power amplifier in accordance with an embodiment is detailed hereinafter.

Figure 3:
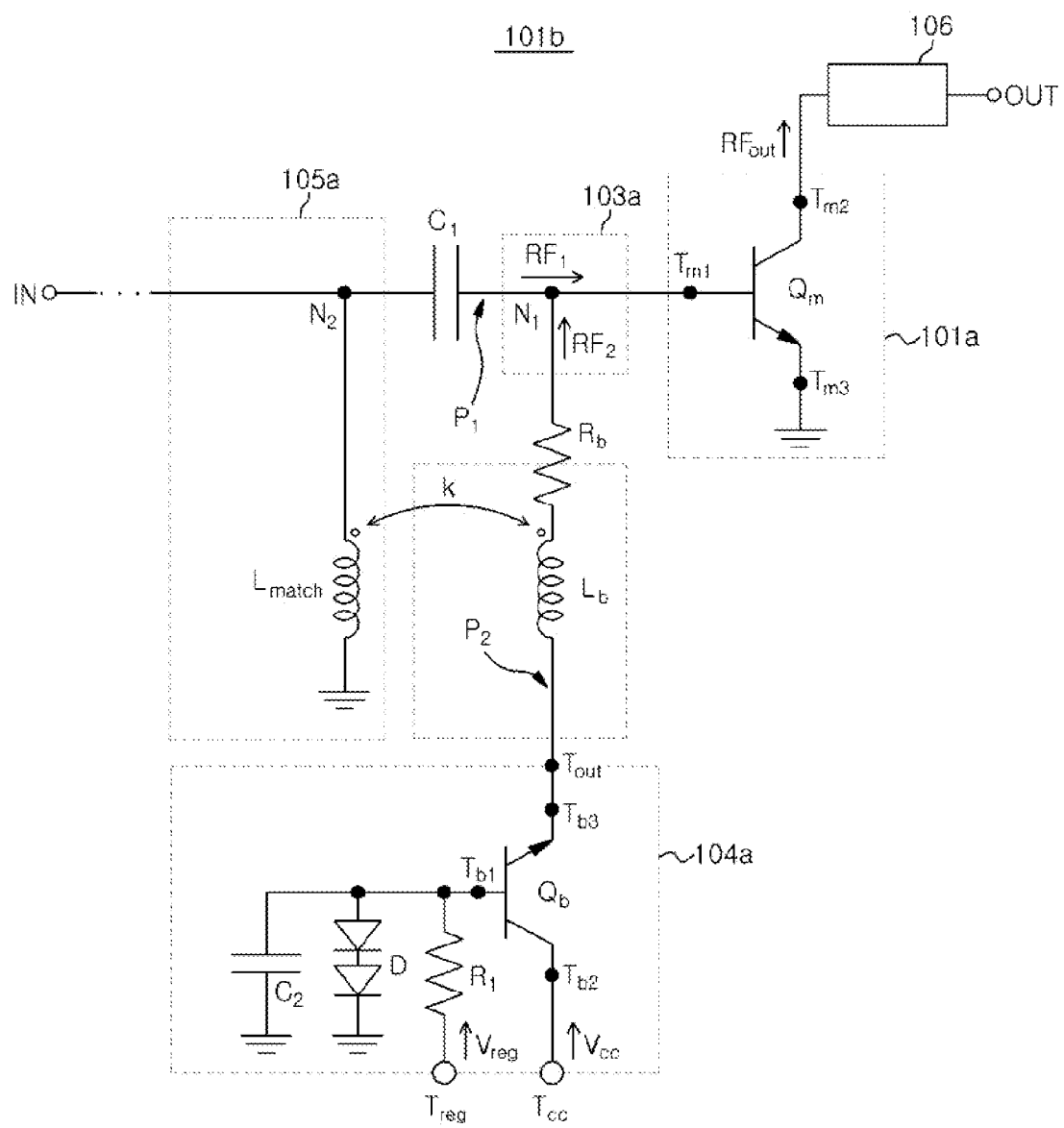
FIG. 3 shows a schematic view of an RF power amplifier in accordance with an embodiment.

FIG. 3 shows a schematic view of an RF power amplifier in accordance with an embodiment of the present teachings.

As shown in FIG. 3, the RF power amplifier 100b may be an example of the RF power amplifiers 100, 100a discussed above in reference to FIGS. 1 and 2. Referring to FIG. 3, the RF power amplifier 100b may comprise an output stage amplifying circuit 101a, a counterpart waveform generator 102a, a bias circuit 104a and an input matching circuit 105a. Optionally, the RF power amplifier 100a may further comprise a resistor $R_b$, a capacitor $C_1$, an input port IN, an output port OUT and/or an output matching circuit 106.

The output stage amplifying circuit 101a may be an example of the output stage amplifying circuit 101 discussed above with reference to FIG. 2. The output stage amplifying circuit 101a may comprise an amplifying transistor $Q_m$. The amplifying transistor $Q_m$ is configured to receive e.g., a modulated RF signal (e.g., the modulated envelope waveform as discussed earlier) as the waveform $RF_1$ via one of its terminals and to output an amplified RF signal (e.g., an amplified waveform $RF_{out}$) as the signal $RF_{out}$ via another terminal thereof. The amplifying transistor $Q_m$ comprises terminals $T_{m1}$, $T_{m2}$, $T_{m3}$.

In the embodiment shown in FIG. 3, the amplifying transistor $Q_m$ may be a bipolar junction transistor (BJT) such as a heterojunction bipolar transistor (HBT). In such case, the terminals $T_{m1}$, $T_{m2}$, $T_{m3}$ are a base, a collector and an emitter, respectively. The base $T_{m1}$ is electrically connected to the node $N_1$ to receive the waveform $RF_1$. As illustrated in the embodiment shown in FIG. 3, the base $T_{m1}$ is the node $N_1$ per se. The collector $T_{m2}$ outputs therethrough the amplified RF signal. The emitter $T_{m3}$ is electrically coupled to the ground potential. Alternatively, in other embodiments, other amplifying transistors may be employed and the interconnection may differ from the embodiment shown in FIG. 3.

The input matching circuit 105a may be an example of the impedance matching circuit 105 discussed above with reference to FIG. 2. The input matching circuit 105a is configured to perform impedance matching on the amplifying transistor $Q_m$. The impedance matching circuit 105a may comprise a node $N_2$ and an inductor $L_{match}$ which is electrically coupled to a ground potential.

The electrical path $P_1$ shown in FIG. 3 may refer to a series of components and/or electrical couplings therebetween which are provided to transmit the modulated RF signal to the amplifying transistor $Q_m$. For this purpose, the electrical path $P_1$ may cover the nodes $N_1$, $N_2$ and the capacitor $C_1$, and is electrically coupled to (or further cover) the terminal $T_{m1}$ of the amplifying transistor $Q_m$.

The electrical path $P_2$ shown in FIG. 3 may refer to a series of components and/or electrical couplings therebetween which are provided to transmit a bias voltage $V_{cc}$ and/or a waveform $RF_2$ to the terminal $T_{m1}$ of the amplifying transistor $Q_m$. For this purpose, the electrical path $P_2$ may cover the node $N_1$, the resistor $R_b$ and an inductor $L_b$, and is electrically coupled to (or further cover) the terminal $T_{m1}$ of the amplifying transistor $Q_m$.

The node $N_1$ is provided on the electrical path $P_1$, and serves as a portion of the compensation circuit 103a which is an example of the compensation circuit 103 discussed above in reference to FIG. 2. The node $N_1$ is electrically coupled between the terminal $T_{m1}$ of the amplifying transistor $Q_m$ and the input matching circuit 105a. Also, the node $N_1$ is disposed between the terminal $T_{m1}$ of the amplifying transistor $Q_m$ and the node $N_2$.

The node $N_2$ is provided on the electrical path $P_1$. The node $N_2$ is electrically coupled to the capacitor $C_1$ and the inductor $L_{match}$ of the input matching circuit 105a.

The capacitor $C_1$ for e.g., DC decoupling and matching, is provided as a passive capacitor on the electrical path while being electrically coupled between the nodes $N_1$, $N_2$.

The bias circuit 104a may be an example of the bias circuit 104 discussed above in reference to FIG. 2. The bias circuit 104a is configured to bias the amplifying transistor $Q_m$ via e.g., the node $N_1$. For this, the bias circuit 104a is electrically coupled to the node $N_1$ via the electrical path $P_2$. The bias circuit 104a comprises input terminals $T_{reg}$, an output terminal $T_{out}$, a transistor $Q_b$, a capacitor $C_2$, diodes D and/or a resistor $R_1$ as shown in FIG. 3. Specifically, the input terminal $T_{cc}$ is configured to receive a bias voltage $V_{Cc}$, and the input terminal $T_{reg}$ is configured to receive a regulated voltage $V_{reg}$. The output terminal $T_{out}$ is electrically coupled to the node $N_1$ and/or the electrical path $P_2$.

The transistor $Q_b$ of the bias circuit 104a comprises terminals $T_{b1}$, $T_{b2}$, $T_{b3}$. The terminal $T_{b1}$ is electrically coupled to the capacitor $C_2$, the diodes D and the resistor $R_1$. The terminal $T_{b2}$ is electrically coupled to the input terminal $T_{cc}$, and a terminal $T_{b3}$ is electrically coupled to the output terminal $T_{out}$ of the bias circuit 104a. In the embodiment shown in FIG. 3, the transistor $Q_b$ may be a BJT, such as an HBT. In such case, the terminals $T_{b1}$, $T_2$, $T_{b3}$ of the transistor $Q_b$ may be a base, a collector, and an emitter, respectively. In other embodiment, the transistor Qb may not be a BJT but other types of transistor.

The capacitor $C_2$ of the bias circuit 104a may be electrically coupled to the terminal $T_{b1}$. For example, in the embodiment shown in FIG. 3, the capacitor $C_2$ is electrically coupled between the terminal $T_{b1}$ of the transistor $Q_b$ and the ground potential. Further, the resistor $R_1$ of the bias circuit 104a may be electrically coupled to the terminal $T_{b1}$. As shown in FIG. 3, the resistor $R_1$ is electrically coupled between the terminal $T_{b1}$ of the transistor $Q_b$ and the input terminal $T_{reg}$.

The counterpart waveform 102a may be an example of the counterpart waveform 102 discussed above with reference to FIG. 2. The counterpart waveform generator 102a is configured to reduce the i.e., the frequency component $F_C$ of the waveform $RF_1$ swinging at the node $N_1$. In the embodiment, the counterpart waveform generator 102a comprises an inductor $L_b$.

The inductor $L_b$ is electrically coupled between the bias circuit 104a and the node $N_1$. In the embodiment, the inductor $L_b$ is disposed on the electrical path $P_2$. The inductor $L_b$ has an inductance whose values is set such that the frequency component $F_C$ of the waveform $RF_1$ is reduced, and substantially eliminated. The inductor $L_b$ is configured to be magnetically coupled with the inductor $L_{match}$ of the input matching circuit 105a.

In the embodiment, the inductor $L_b$ and the inductor $L_{match}$ are magnetically coupled with a preset coupling coefficient which is set such that that the frequency component $F_C$) of the waveform $RF_1$ is reduced, and substantially, eliminated. For instance, the inductors $L_b$ and $L_{match}$ may be a pair of coils magnetically coupled to each other while being arranged with a gap therebetween. In such case, the coefficient of the magnetic coupling can be represented by using e.g., a coupling constant k (which is, in general, a value defined between zero and one while satisfying a certain equation, e.g., $k=M \cdot (L_a \cdot L_b)^{1/2}$ where La and Lb denotes inductance of two coils and M denotes mutual inductance between them). The operations of the counterpart waveform generator 102a will be explained later in more detail.

As mentioned above, there may be one or more additional components in addition to the above explained components depending on embodiments. In the embodiment, for instance, the resistor $R_b$ for e.g., resistor ballasting, is provided to be electrically coupled between the inductor $L_b$ and the node $N_1$. Also, the capacitor $C_1$ is provided to be electrically coupled between the nodes $N_1$, $N_2$. Furthermore, the input port IN is provided to the RF power amplifier 100b to receive an RF input signal (e.g., the modulated RF signal discussed above with reference to FIG. 2). The input port IN is electrically coupled to the node $N_2$. In addition, the output port OUT is provided to the RF power amplifier to output an RF output signal (e.g., the modulated RF signal discussed above with reference to FIG. 2). The output port OUT is electrically coupled to the terminal $T_{m2}$ of the amplifying transistor $Q_m$ via the output matching circuit 106.

Figure 4:
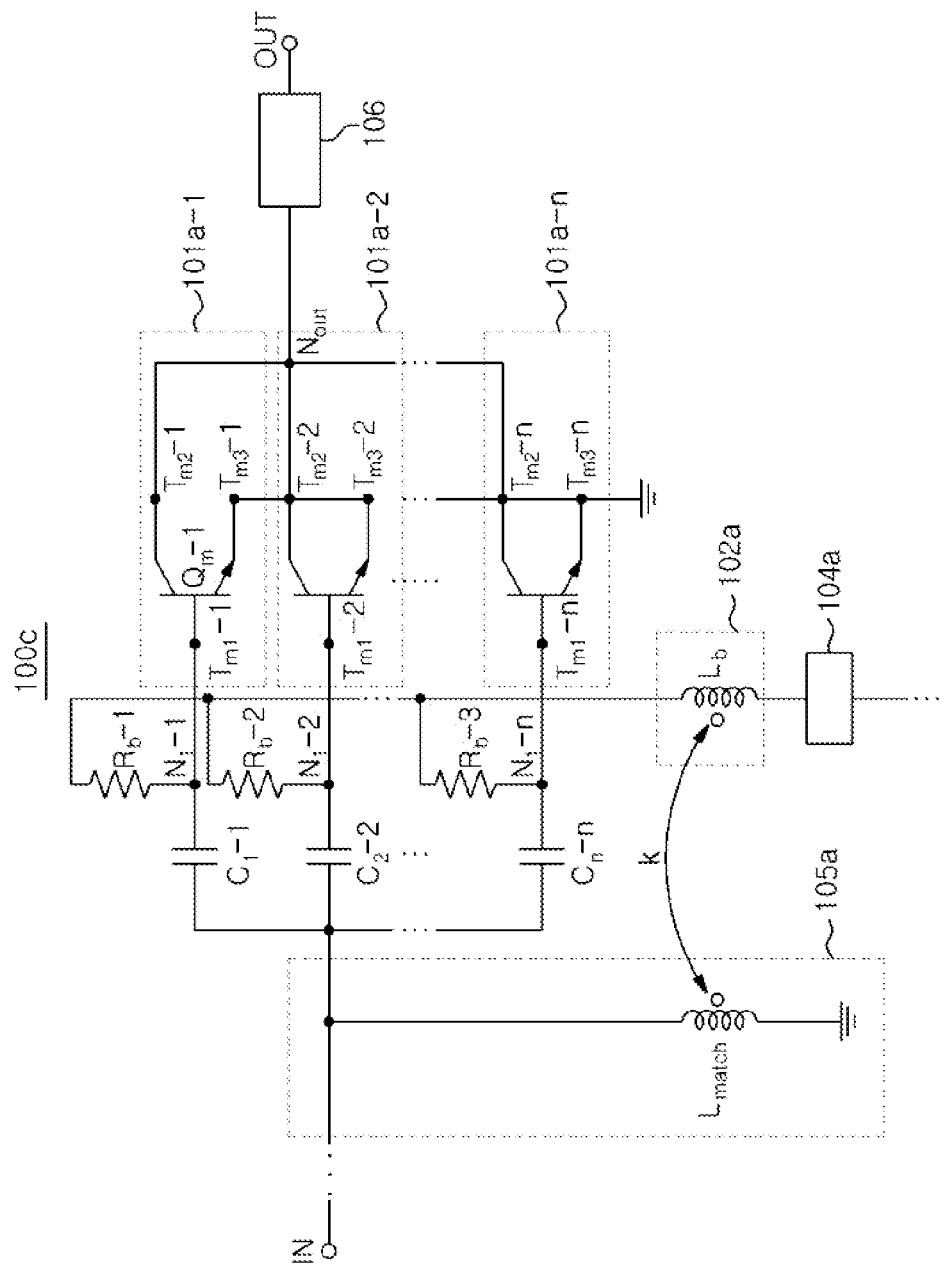
FIG. 4 illustrates a schematic view of an RF power amplifier with a plurality of output stage amplifying circuits in accordance with an embodiment of the present teachings.

In addition, the RF power amplifier may further comprise one or more additional of output stage amplifying circuits to obtain higher power for instance. FIG. 4 illustrates a schematic view of an RF power amplifier 100c with a plurality of output stage amplifying circuits in accordance with an embodiment of the present teachings. For purposes of convenience in discussion, differences between the RF power amplifiers 100b and 100c are mainly explained herein.

Referring to FIG. 4, the output stage amplifying circuits 101a-1 to 101a-n are electrically coupled in parallel while sharing the input port IN, the input matching circuit 105a, a node $N_2$, the counterpart waveform generator 102a, the bias circuit 104a, a node $N_{out}$, the output matching circuit 106 and the output port OUT.

Specifically, the output stage amplifying circuits 101a-1 to 101a-n may comprise amplifying transistors Qm-1 to Qm-n, respectively. Each of the amplifying transistors Qm-1 to Qm-n may be identical to the amplifying transistor $Q_m$ discussed above in reference to FIG. 3 in their structures and functions.

The terminals $T_{m1}$-1 to $T_{m1}$-n of the amplifying transistors $Q_m$-1 to $Q_m$-n are electrically coupled to the node $N_2$ via the capacitors $C_1$-1 to $C_1$-n, respectively. The capacitors $C_1$-1 to $C_1$-n may be identical to the capacitor $C_1$ discussed above in reference to FIG. 3 in their structures and functions. The capacitors $C_1$-1 to $C_1$-n are provided for DC decoupling between the terminals $T_{m1}$-1 to $T_{m1}$-n. The terminals $T_{m2}$-1 to $T_{m2}$-n of the amplifying transistors $Q_m$-1 to $Q_m$-n are electrically coupled to the output port OUT through the node $N_{out}$. In various embodiments, the output matching circuit 106 may be electrically coupled between the node $N_{out}$ and the output port OUT, as shown in FIG. 4. The terminals $T_{m3}$-1 to $T_{m3}$-n of the amplifying transistors $Q_m$-1 to $Q_m$-n are grounded.

Nodes $N_1$-1 to $N_1$-n are electrically coupled between the capacitors $C_1$-1 to $C_1$-n and the terminals $T_{m1}$-1 to $T_{m1}$-n, respectively. Further, the counterpart waveform generator 102a is electrically coupled to the nodes $N_1$-n to $N_1$-n via the resistors $R_1$-1 to $R_1$-n, respectively for base ballasting and preventing thermal run-away.

Figure 5:
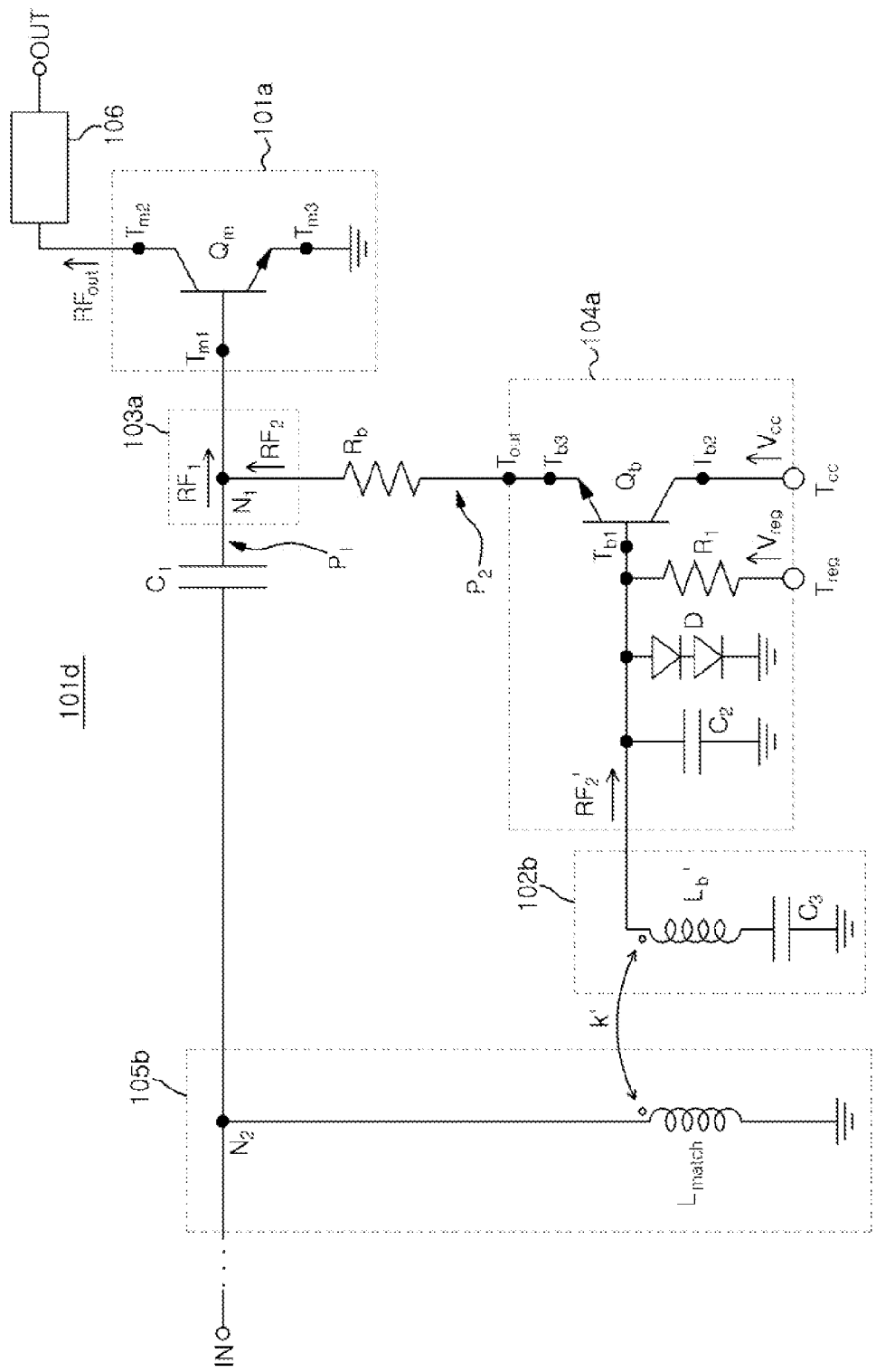
FIG. 5 illustrates a schematic view of an RF power amplifier with alternative counterpart waveform generator in accordance with an embodiment of the present teachings.

Alternatively, the counterpart waveform generator in accordance with the present teaching can be implemented in another way. For instance, FIG. 5 illustrates a schematic view of an RF power amplifier with alternative counterpart waveform generator in accordance with an embodiment of the present teachings. The counterpart waveform generator 102b is electrically coupled to the capacitor $C_2$ and the diodes D in parallel between the terminal $T_{b1}$ of the transistor $Q_b$ and the ground potential. The counterpart waveform generator 102b may comprise an inductor $L_b'$ and a capacitor $C_3$. The capacitor $C_3$ is electrically connected between the ground potential and the inductor $L_b'$ as a DC decoupling cap. The inductor $L_b'$ is electrically coupled between the capacitor $C_3$ and the terminal $T_{b1}$ of the transistor $Q_b$. In the aforementioned configuration of the counterpart waveform generator 102b can also play almost same role as that of the counterpart waveform generator 102a shown in FIG. 3 except that, the counterpart waveform generator 102b may be configured to generate an intermediate waveform $RF_2'$ that causes the bias circuit 104a to output the waveform $RF_2$. Further, the coefficient k' of the magnetic coupling between them may have a different value from the coefficient k discussed above with reference to FIG. 3 depending on a given condition.

Meanwhile, the present teachings are not limited to the RF power amplifier and the apparatus using same. For instance, a device for use in an RF power amplifier is also within the present teachings. Such device may be implemented by using the components discussed above. For example, the device may comprise a first electrical path configured to transmit an RF signal to a terminal of an amplifying transistor of the RF power amplifier, the first electrical path comprising a first node and a second node, the first node being disposed between the terminal of the amplifying transistor and the second node; a second electrical path configured to transmit a bias voltage to the first terminal of the amplifying transistor, the second electrical path being electrically coupled to the first node; a first inductor electrically coupled between the second node and a ground potential; and a counterpart waveform generator configured to reduce a portion of frequency waveform of the RF signal swinging at the first node, wherein the counterpart waveform generator comprise a second inductor disposed on the second electrical path, and the first inductor and the second inductor are magnetically coupled with a preset coupling coefficient. The coupling coefficient is set such that the portion of frequency waveform becomes zero. The magnetic coupling member may comprise a pair of coils magnetically coupled to each other with a gap therebetween, the coils being electrically coupled to the first inductor and the second inductor, respectively. The device may further comprise a capacitor electrically coupled between the first node and the second node; and a resistor electrically coupled between the second inductor and the first node. The first electrical path is electrically coupled to a bipolar junction transistor (BJT) as the amplifying transistor, the terminal thereof to which the RF signal is transmitted being a base of the BJT. The device may further comprise a bias circuit configured to bias the amplifying transistor, the bias circuit being electrically coupled to the first node via the second electrical path, wherein the bias circuit comprises a first input terminal configured to receive the bias voltage; a second input terminal configured to receive a regulated voltage; an output terminal electrically coupled to the second electrical path; an additional transistor comprising a first terminal, a second terminal electrically coupled to the first input terminal, and a third terminal electrically coupled to the output terminal; a capacitor electrically coupled between the first terminal of the additional transistor and the ground potential; and a resistor electrically coupled between the first terminal of the additional transistor and the second input terminal.

Meanwhile, a method in accordance with an embodiment of the present teachings is explained with reference to FIG. 6 which illustrates a flow chart of a method for amplifying a power signal in accordance with an embodiment of the present teachings.

Referring to FIG. 6, the method may comprise steps S100, S200 and S300. It is noted that the steps and their sub-steps explained below are explained and illustrated in a certain order, however, such order is an example merely for purpose of explanation. The steps and the sub-steps can be performed at least partially in different order, and/or at the same time. They also can be repeated depending on the given power signal.

At step S100, an envelope modulated signal is amplified by using an output stage amplifying circuit (e.g., one of those discussed above). The envelope modulated signal comprises a carrier radio frequency portion and an envelope frequency component. In the method, impedance matching is also performed for the output stage amplifying circuit by using an impedance matching circuit (e.g., one of those discussed above) which is electrically coupled to the output stage amplifying circuit. The impedance matching circuit comprises an additional inductor (e.g., one of those discussed above).

Meanwhile, at step S200, a corresponding frequency waveform (e.g., the waveform $RF_2$) which corresponds to a portion of frequency components (e.g., the first frequency component $F_C$) of the envelope modulated signal (e.g., the first waveform $RF_1$) is generated. For example, the corresponding frequency waveform is induced, by using an inductor (e.g., one of those discussed above), from a magnetic coupling provided to the inductor at this step S200. For this, a coefficient of the magnetic coupling may be set such that the first frequency component of the envelope modulated signal is substantially eliminated. Also, an inductance of the inductor may be set such that the first frequency component of the envelope modulated signal is substantially eliminated. The magnetic coupling is provided between the inductor for inducing the corresponding frequency waveform and the additional inductor of the impedance matching circuit.

Then, at step S300, the corresponding frequency waveform is applied to the output stage amplifying circuit so as to generate a power output that is substantially independent of the first frequency component of the envelope modulated signal. For instance, the envelope frequency component is substantially eliminated such that the power output corresponds substantially to the carrier radio frequency portion of the envelope modulated signal.

Hereinafter, how the embodiments discussed above provide improved linearity is explained hereinafter in more detail.

As discussed above, a specific portion of the frequency components of the waveform $RF_1$ (i.e., the frequency component $F_C$ discussed above) is reduced, or substantially eliminated. This is done by generating a counterpart signal (i.e., the waveform $RF_2$ and/or the corresponding frequency waveform referred to above) that is substantially similar to the frequency component of the waveform $RF_1$.

Figure 7A:
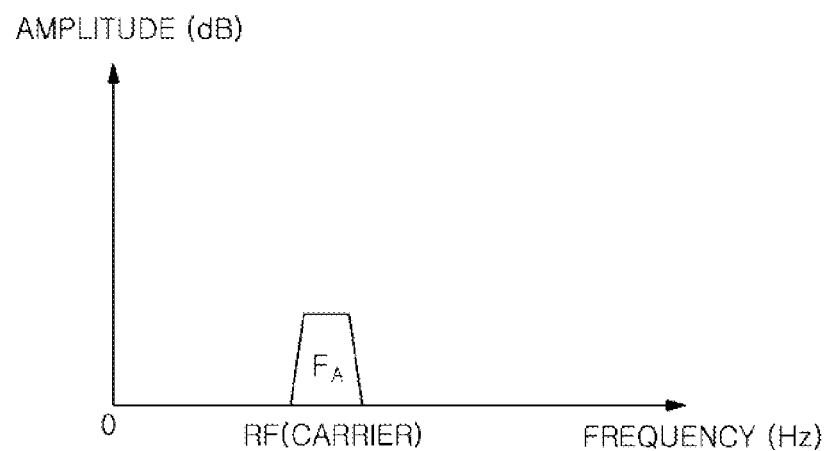
FIG. 7A represents a frequency spectrum of an RF input signal which is inputted to an amplifying transistor in general.

Here, the waveform $RF_1$ refers to the signal transmitted through the node $N_1$ (or the nodes $N_1$-1 to $N_1$-n) and amplified by the output stage amplifying circuit. As discussed above, the waveform $RF_1$ comprises an envelope-modulated RF signal, especially for the cellular power amplifier. This signal corresponds to an RF (carrier) frequency component $F_A$ in FIG. 7A showing a frequency spectrum of an RF input signal which is inputted to an amplifying transistor in general.

Figure 7B:
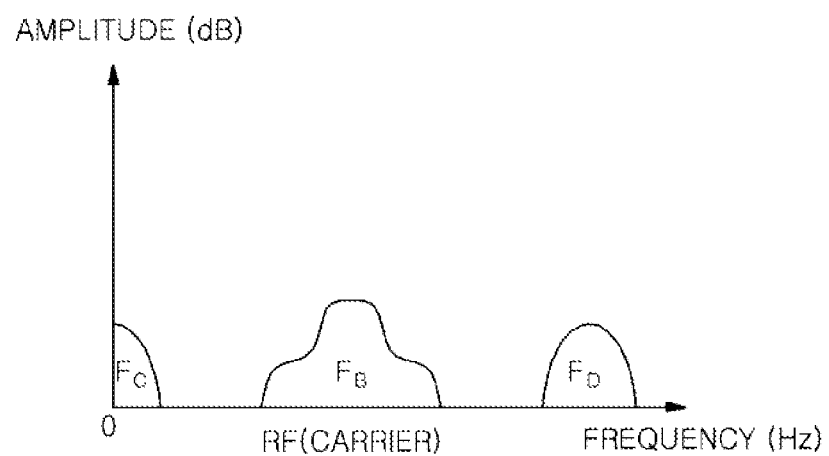
FIG. 7B shows a frequency spectrum of an RF waveform caused by an amplifying transistor in general.

However, the waveform $RF_1$ may further comprise another frequency component for some reasons. FIG. 7B shows a frequency spectrum of an RF waveform caused by an amplifying transistor in general. Referring to FIG. 7B, the RF waveform caused by an amplifying transistor comprises a carrier frequency component $F_B$, which is desired to be transmitted as an output signal. Also, second order nonlinearity of the RF power amplifier causes intermodulation components such as frequency components $F_C$ and $F_D$. Especially, the frequency component located at lower domain than that of the RF carrier frequency component $F_B$ in FIG. 7B is transmitted through the terminal $T_{m1}$ and the node $N_1$. This frequency component existing as the portion of frequency components of the waveform $RF_1$ at the node $N_1$ is what is referred to above as the frequency component $F_C$. While at least a portion of frequency components $F_C$ and $F_D$ outputted toward the output port OUT can be removed by e.g., a filter, such filter cannot remove the frequency component $F_C$ at the terminal $T_{m1}$ and the node $N_1$.

For linear amplification, it is required that the RF power amplifier has a fixed bias voltage. However, in the presence of the frequency component $F_C$, the bias voltage is modulated by frequency component $F_C$, and then the RF power amplifier operates in different bias conditions depending on the frequency component $F_C$. For example, as the envelope modulation signal bandwidth goes up, the frequency component $F_C$ starts to be distorted by resistive-capacitive (RC) delay between the capacitor $C_1$ and the amplifying transistor $Q_m$. As a result, an RC delayed signal modulates the RF power amplifier and generates the memory effect.

Figure 11A:
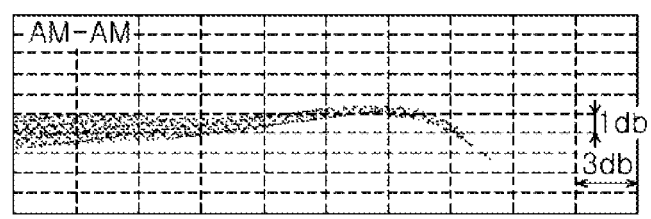
FIGS. 11A and 11B show measured dynamic AM-AM and AM-PM characteristics of the RF power amplifier without the counterpart waveform generator.
Figure 11B:
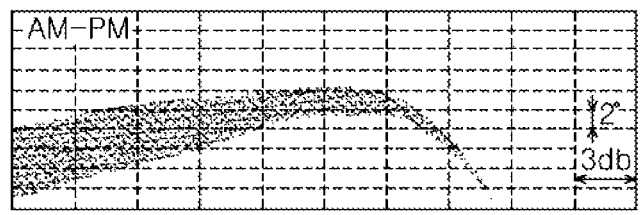

The memory effect may refer to a waveform distortion caused by a mutual relation between the nonlinear characteristics of the circuit and various frequency characteristics of the circuit. In the presence of the memory effect, the RF power amplifier may behave as if an RF output signal therefrom is not determined by an RF input signal that is currently given, but by a series of RF input signals that have been received so far. Such behavior results in various outputs even for the same input, and, thus leads to degraded linearity (e.g., dispersed or spread output signals as shown in FIGS. 11A and 11B).

Figure 8:
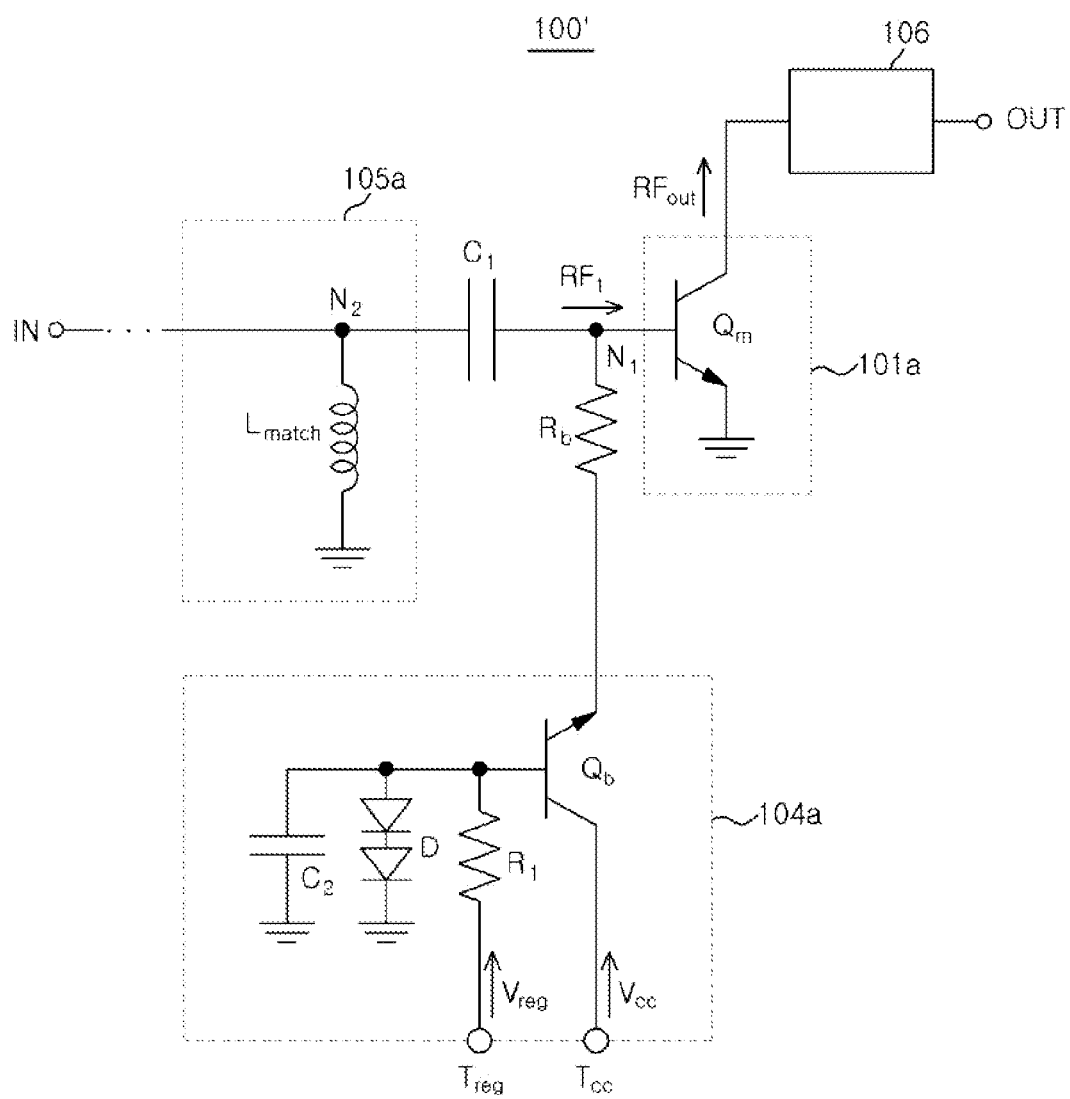
FIG. 8 shows a schematic view of an RF power amplifier without a counterpart waveform generator.

In order to reduce and substantially minimize the memory effect, analysis of given circuits for amplifying an RF signal may be a prerequisite. The analysis may be demonstrated using the circuit shown in FIG. 8. FIG. 8 shows a schematic view of an RF power amplifier 100' which is similar to what is depicted in FIG. 3 except that the counterpart waveform generator 102a shown in FIG. 3 does not exist. Then, by way of analysis, the given RF power amplifier 100' is simplified as an equivalent circuit such as what is shown in FIG. 9.

Figure 9:
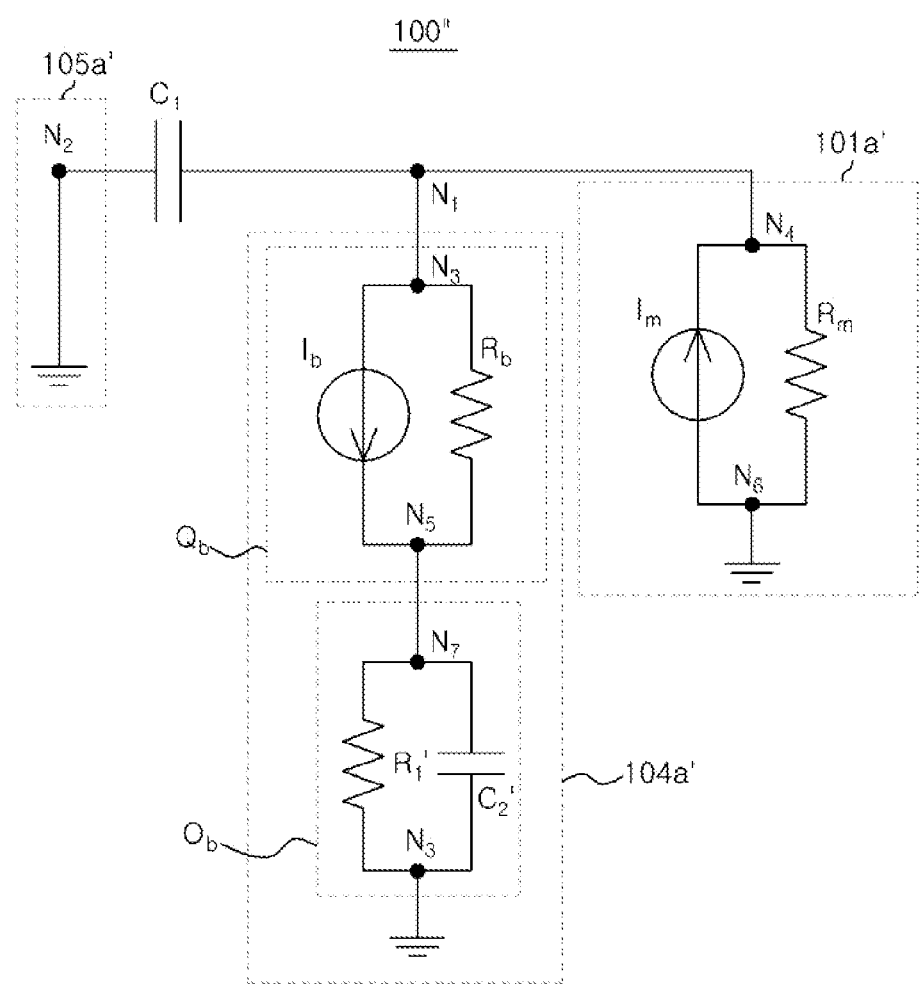
FIG. 9 depicts a schematic view of an equivalent circuit of the RF amplifier structure of FIG. 8 in view of its frequency component $F_C$.

FIG. 9 depicts a schematic view of an equivalent circuit of the RF amplifier structure of FIG. 8 in view of its frequency component $F_C$. The equivalent circuit 100" shown in FIG. 9 comprises current sources $I_b$, $I_m$, capacitors $C_1$, $C_2'$ and (constant) resistors $R_m$, $R_b$, $R_1'$. The equivalent circuit further comprises nodes $N_1$ to $N_8$ provided at least for the purpose of explanation.

As shown in FIG. 9, the capacitor $C_1$ may be electrically coupled between the nodes $N_1$, $N_2$. The node $N_1$ is also electrically coupled to the nodes $N_3$, $N_4$, and the node $N_2$ is also electrically coupled to the ground potential.

Further, the amplifying transistor $Q_m$ in FIG. 8 is replaced by a corresponding circuit portion $Q_m'$ which comprises the nodes $N_4$, $N_6$, the current source $I_m$ and the resistor $R_m$. Particularly, the amplifying transistor $Q_m$ is a transistor, and its junction between terminals $T_{m1}$ and $T_{m3}$ (e.g., a base-emitter junction when the transistor is BJT) can be considered as a diode. Accordingly, in a desired equivalent circuit, the amplifying transistor $Q_m$ can be simplified into a non-linear resistive component and a parasitic capacitive component which are electrically coupled in parallel. However, the parasitic capacitive component is not considerably big enough at the frequency range of the frequency component $F_C$, it can be omitted, and thus, the amplifying transistor $Q_m$ can be further simplified into the resistor $R_m$ and the current source $I_m$ which come from the nonlinear resistive component. The resistor $R_m$ and the current source $I_m$ are electrically coupled to each other in parallel between the nodes $N_3$, $N_5$. As a result, the output stage amplifying circuit 101a in FIG. 8 is replaced by a circuit portion 101a' which comprises the circuit portion $Q_m'$ and the ground potential which are electrically coupled to each other in series.

Likewise, the transistor $Q_b$ of the bias circuit 104a in FIG. 8 is substituted with a corresponding circuit portion $Q_b'$ which comprises the nodes $N_3$, $N_5$, the current source $I_b$ and the resistor $R_b$. The resistor $R_b$ and the current source $I_b$ are electrically coupled to each other in parallel between the nodes $N_3$ and $N_5$, as shown in FIG. 9. The node $N_5$ is electrically connected to the node $N_7$.

The remaining components $C_2$, D, $R_1$ of the bias circuit 104a in FIG. 8, which are electrically coupled to the terminal $T_{b1}$ of the transistor $Q_b$ as shown in FIG. 8 can be simplified into a corresponding circuit portion $O_b$ which comprises resistor $R_1'$, the capacitor $C_2'$ and the nodes $N_7$, $N_8$. The resistor $R_1'$ and the capacitor $C_2'$ which are electrically coupled to each other in parallel between the nodes $N_7$, $N_8$. The node $N_8$ is electrically connected to the ground potential. As a result, the bias circuit 104a in FIG. 8 is replaced by a circuit portion 104a' which comprises the circuit portions $Q_b'$ and $O_b$ and the ground potential which are electrically coupled to one another in series and in that order.

The (shunt) inductor $L_{match}$ of the impedance matching circuit 105a in FIG. 8 is considered as a short circuit at the frequency range of the envelope component $F_C$. Accordingly, in the equivalent circuit in FIG. 9, the impedance matching circuit 105a is replaced by a circuit portion 105a' which comprises the node $N_2$ electrically coupled to the ground potential. The capacitor $C_1$ is electrically coupled between the nodes $N_1$ and $N_2$. In addition, the resistor $R_b$ in FIG. 8 is omitted in the equivalent circuit shown in FIG. 9 since its value is small enough to be ignored in this analysis.

In the above equivalent circuit, a node voltage at the node $N_1$ (hereinafter, also referred to as "$V_1$") corresponds to the frequency component $F_C$ transmitted through the node $N_1$ (and the terminal $T_{m1}$) in FIG. 3. Since the frequency component $F_C$ is one of factors causing the memory effect as discussed above, reducing the node voltage $V_1$ corresponding to this frequency component can be an option to reduce the memory effect. Further, if possible, it can be considered to make the node voltage $V_1$ zero.

By using Ohm's law, the relationship between current and voltage in the equivalent circuit in FIG. 9 can be described as following equations (1) and (2):

$$\frac{V_7}{Z_{Ob}} = \frac{V_1 - V_7}{R_{Rb}} = I_{Ib} \tag{1}$$

$$\frac{V_7}{Z_{Ob}} + \frac{V_1}{Z'_{Qm}} = I_{Im}, \text{ where } R_m // C_1 \tag{2}$$

where "$V_7$" denotes a node voltage at the node $N_7$; "$Z_{Ob}$" denotes an impedance of the circuit portion $O_b$; "$R_{Rb}$" denotes a resistance value of the resistor $R_b$; "$I_{Im}$" denotes a current value of the current source $I_m$; and "$Z'_{Qm}$" denotes an impedance of the circuit portion $Q_m'$; "$I_{Im}$" denotes a current value of the current source $I_m$.

Then, the node voltage $V_1$ is derived by combining two equations (1) and (2) as follows:

$$\therefore V_1 = \frac{Z'_{Qm}}{Z'_{Qm} + R_{Rb} + Z_{Ob}}\{(R_{Rb} + Z_{Ob}) \cdot I_{Im} - R_{Rb} \cdot I_{Ib}\} \tag{3}$$

In order to make the node voltage $V_1$ zero in equation (3), the following equation (4) should be satisfied:

$$(R_{Rb} + Z_{Ob}) \cdot I_{Im} - R_{Rb} \cdot I_{Ib} = 0 \tag{4}$$

From equation (4), the two conditions are derived as conditions for making the node voltage $V_1$ zero, as provided below:

$$\text{Imag}(Z_{Ob}) = 0 \tag{5}$$

$$(R_{Rb} + \text{Real}(Z_{Ob})) \cdot I_{Im} \cdot R_{Rb} \cdot I_{Ib} \tag{6}$$

where "$\text{Imag}(Z_{Ob})$" denotes an imaginary part of "$Z_{Ob}$"; and "$\text{Real}(Z_{Ob})$" denotes an real part thereof.

In view of equations (5) and (6), however, the node voltage $V_1$ cannot be zero from the equivalent circuit 100" in FIG. 9 because the circuit portion $O_b$ is composed of the resistor $R_1$ and the capacitor $C_2$. In order to resolve this, the inductor $L_b$ as shown in FIG. 3 is added. Then, Imaginary part of $Z_{Ob}$ can be zero at the frequency range of the frequency component $F_C$ by optimizing its inductance value.

However, this solution may cause another problem that the inductor $L_b$ blocks RF signal excursion from the output stage amplifying circuit to the bias circuit. Then, nonlinear mixing process in the transistor $Q_b$ is suppressed and thus, a resultant current from current source $I_b$ is also reduced. Accordingly, equation (6) cannot be met and the frequency component $F_C$ and the memory effect cased thereby still remains.

In order to resolve this, inductive signal injection technique is applied as shown in FIG. 3 and/or FIG. 5. For instance, the inductors $L_{match}$ and $L_b$ are magnetically coupled with a specific coupling coefficient k. Then, voltage swing at the inductor $L_{match}$ is applied to the inductor $L_b$ and the transistor $Q_b$, which generates large current value $I_{Ib}$. By optimizing the coupling coefficient k, an optimum current value $I_{Ib}$ can be found to satisfy the equation (6). As a result, equations (5) and (6) are met by adding the inductor $L_b$ and by using the inductive signal injection technique as described above. As a result, the memory effect can be minimized.

In addition, influence of the counterpart waveform generator, which is obtained by the aforementioned analysis, on another frequency components $F_B$ and $F_D$ is not considerably large. Further, even in case where such influence is considerably large, it can be resolved by optimizing the configurations of the input matching circuit.

Figure 10A:
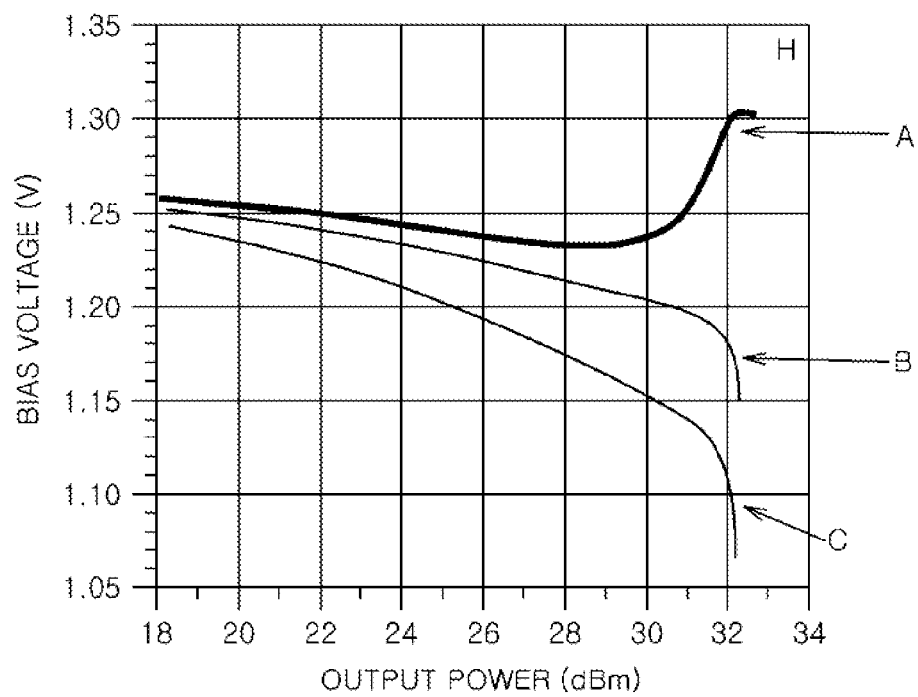
FIGS. 10A and 10B illustrate results of continuous wave (CW) simulation and 2-tone simulation performed with 40 MHz of tone spacing on RF power amplifiers.
Figure 10B:
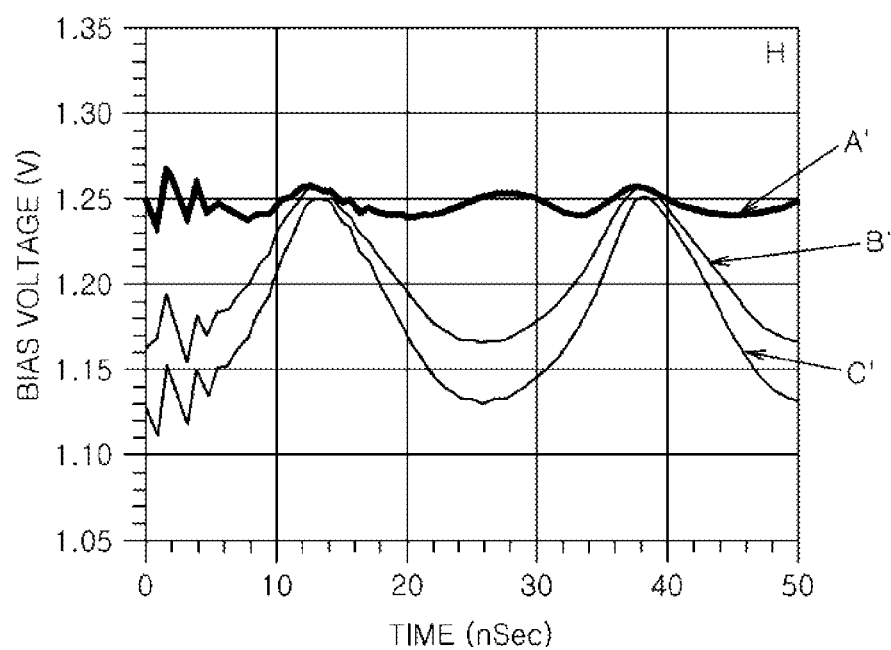

FIGS. 10A and 10B illustrate results of continuous wave (CW) simulation and 2-tone simulation performed with 40 MHz of tone spacing on RF power amplifiers.

As represented by a curve B shown in FIG. 10A, an RF power amplifier without the counterpart waveform generator (e.g. the RF power amplifier 100' as shown in FIG. 8) operates such that a bias voltage at the node $N_1$ in the entire frequency range of the waveform $F_C$ is compressed as the output power is increased. Then, represented by a curve B' shown in FIG. 10B, the bias voltage at the node $N_1$ is also compressed at the time (25 ns) when the large RF input signal is applied.

Furthermore, as represented by curves C, C' shown in FIGS. 10A and 10B, when the inductor $L_b$ is added to the RF power amplifier 100' as shown in FIG. 8 without applying the inductive signal injection technique (e.g., the magnetic coupling between the inductors $L_b$ and $L_{match}$), the bias voltage is further compressed as explained above.

Contrarily, as represented by curves A, A' shown in FIGS. 10A and 10B, when the magnetic coupling as well as the inductor $L_b$ is added, the bias voltage can be controlled from the compressed condition to boosted condition. After optimizing the amount of coupling, bias voltage is boosted. Especially, 2-tone simulation as shown in FIG. 10B shows that the fluctuation of the bias voltage is minimized which is optimal condition for reducing memory effect and thereby improving linearity of the entire RF power amplifier.

Figure 12A:
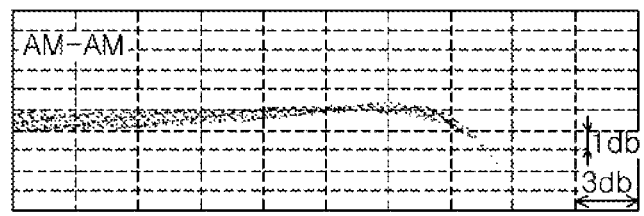
FIGS. 12A and 12B show measured dynamic AM-AM and AM-PM characteristics of the RF power amplifier with the counterpart waveform.
Figure 12B:
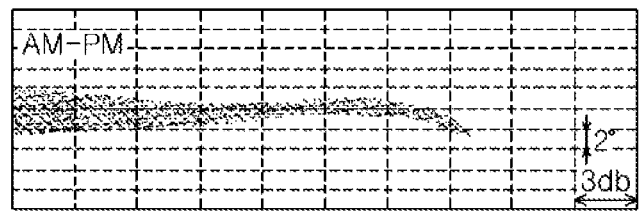

FIGS. 11A and 11B show measured dynamic AM-AM and AM-PM characteristics of the RF power amplifier without the counterpart waveform generator, and FIGS. 12A and 12B show measured dynamic AM-AM and AM-PM characteristics of the RF power amplifier with the counterpart waveform generator discussed above. While, dots in FIGS. 11A and 11B are relatively dispersed in proportion to the amount of the memory effect, the RF power amplifier show less dispersion. The biggest differences in the memory effect are shown at low dynamic output power region in the AM-PM graphs.

In view of this disclosure, it is to be noted that the protection circuit can be implemented in a variety of elements and variant structures. Further, the various elements, structures and parameters are included for purposes of illustrative explanation only and not in any limiting sense. In view of this disclosure, those skilled in the art may be able to implement the present teachings in determining their own applications and needed elements and equipment to implement these applications, while remaining within the scope of the appended claims.

Different aspects, embodiments or implementations may, but need not, yield one or more of the following advantages. For example, the coefficient, interconnection between circuit blocks in various embodiments may improve linearity and may eliminate memory effect.

What is claimed is:

1. A radio frequency (RF) power amplifier, comprising:
    an output stage amplifying circuit configured to receive a first waveform through an input node, and to amplify the first waveform so as to output an amplified waveform through an output node; and
    a counterpart waveform generator configured to generate a second waveform corresponding to a portion of frequency components of the first waveform, the output stage amplifying circuit and the counterpart waveform generator being electrically coupled such that the second waveform is applied to the input node of the output stage amplifying circuit to substantially compensate the portion of frequency components of the first waveform, wherein the counterpart waveform generator comprises an inductor which is electrically coupled to the input node of the output stage amplifying circuit, the inductor being configured to induce the second waveform from a magnetic coupling provided thereto.

2. The RF power amplifier of claim 1, further comprising a bias circuit configured to bias the output stage amplifying circuit, the bias circuit being electrically coupled to the input node of the output stage amplifying circuit,
    wherein the inductor is electrically coupled between the bias circuit and the input node of the output stage amplifying circuit.

3. The RF power amplifier of claim 1, further comprising an impedance matching circuit configured to perform impedance matching for the output stage amplifying circuit, the impedance matching circuit being electrically coupled to the input node of the output stage amplifying circuit, the impedance matching circuit comprising an additional inductor,
    wherein the magnetic coupling is provided between the inductor and the additional inductor.

4. The RF power amplifier of claim 3, wherein the inductor and the additional inductor are a pair of coils arranged with a gap therebetween.

5. The RF power amplifier of claim 1, wherein the magnetic coupling has a coefficient set such that the portion of frequency components of the first waveform is substantially eliminated.

6. The RF power amplifier of claim 1, wherein the inductor has an inductance set such that the portion of frequency components of the first waveform is substantially eliminated.

7. A cellular mobile system, comprising:
    an output stage amplifying circuit configured to amplify a first waveform, wherein the first waveform comprises a first frequency component; and
    a counterpart waveform generator configured to generate a second waveform such that the second waveform is adaptable to substantially compensate the first frequency component of the first waveform and to generate a first signal that is substantially independent from the first frequency component of the first waveform, wherein the counterpart waveform generator comprises an inductor which is electrically coupled to the output stage amplifying circuit, the inductor being configured to induce the second waveform from a magnetic coupling provided thereto.

8. The cellular mobile system of claim 7, further comprising a bias circuit configured to bias the output stage amplifying circuit,
    wherein the inductor is electrically coupled between the bias circuit and the output stage amplifying circuit.

9. The cellular mobile system of claim 7, further comprising a power amplifier, wherein the output stage amplifying circuit is a portion of the power amplifier configured to receive a modulated envelope waveform as the first waveform.

10. The cellular mobile system of claim 7, wherein the second waveform of the counterpart waveform generator is injected into an input node of the output stage amplifying circuit so as to substantially eliminate the first frequency component of the first waveform.

11. The cellular mobile system of claim 7, further comprising a compensation circuit configured to receive the first waveform and the second waveform, wherein the compensation circuit is configured to substantially compensate the first frequency component of the first waveform provided thereto.

12. The cellular mobile system of claim 7, wherein the output stage amplifying circuit comprises a bipolar junction transistor.

13. A method for amplifying a power signal, comprising:
amplifying an envelope modulated signal by using an output stage amplifying circuit;
generating a corresponding frequency waveform to a first frequency component of the envelope modulated signal, the generating a corresponding waveform comprising inducing, by using an inductor, the corresponding frequency waveform from a magnetic coupling provided to the inductor; and
applying the corresponding frequency waveform to the output stage amplifying circuit so as to generate a power output that is substantially independent of the first frequency component of the envelope modulated signal.

14. The method of claim 13, wherein the envelope modulated signal comprises a carrier radio frequency portion and an envelope frequency component, and wherein said applying the corresponding frequency waveform to the output stage amplifying circuit comprises substantially compensating the envelope frequency component such that the power output corresponds substantially to the carrier radio frequency portion of the envelope modulated signal.

15. The method of claim 13, further comprising performing impedance matching for the output stage amplifying circuit by using an impedance matching circuit which is electrically coupled to the output stage amplifying circuit, the impedance matching circuit comprising an additional inductor,
wherein the magnetic coupling is provided between the inductor and the additional inductor.

16. The method of claim 13, wherein said generating the corresponding frequency waveform further comprises setting a coefficient of the magnetic coupling such that the first frequency component of the envelope modulated signal is substantially eliminated.

17. The method of claim 13, wherein said generating the corresponding waveform further comprises setting an inductance of the inductor such that the first frequency component of the envelope modulated signal is substantially eliminated.

* * * * *